July 11, 1961 F. B. ROBERTS 2,992,397
OSCILLATOR HAVING OUTPUT MEANS TO SELECTIVELY PROVIDE FOR CRYSTAL CALIBRATION AND IMPEDANCE MATCHING
Filed March 2, 1959
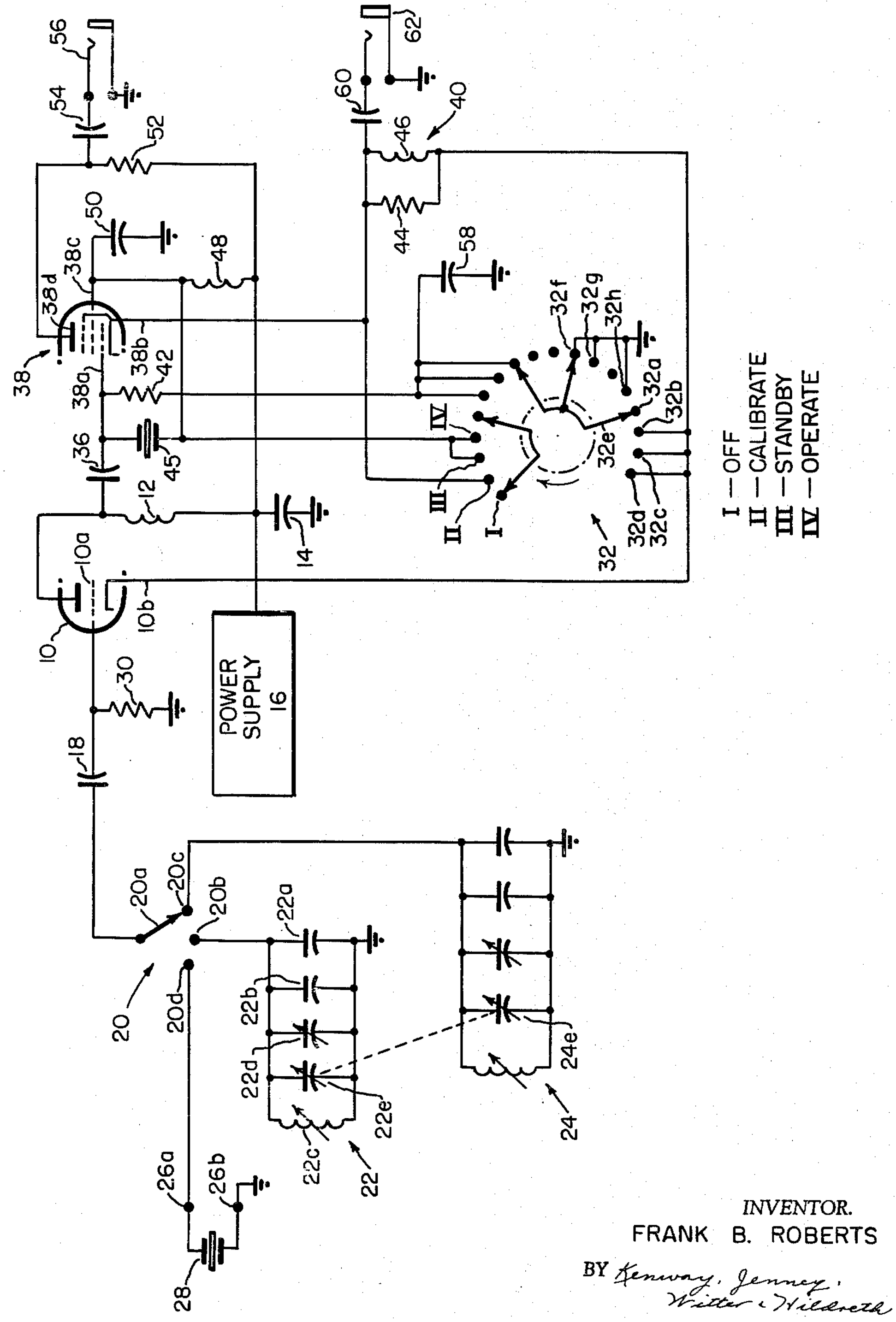
INVENTOR.
FRANK B. ROBERTS
BY Kenway, Jenney, Witter & Hildreth
ATTORNEYS United States Patent Office 2,992,397

Patented July 11, 1961

2,992,397

OSCILLATOR HAVING OUTPUT MEANS TO SELECTIVELY PROVIDE FOR CRYSTAL CALIBRATION AND IMPEDANCE MATCHING

Frank B. Roberts, Marblehead, Mass., assignor to National Company, Inc., Malden, Mass., a corporation of Massachusetts Filed Mar. 2, 1959, Ser. No. 796,304
7 Claims. (Cl. 331—44)

This invention relates to an improved variable frequency oscillator for use, for example, in controlling the frequency of a radio transmitter. More particularly, it relates to a variable frequency oscillator of the type described which provides for crystal calibration and impedance matching by the use of a single electron tube or transistor.

The use of variable frequency oscillators for the control of transmitter frequency is known in the field of electrical communications. The primary advantage of such oscillators over crystal-controlled oscillators is that they permit the transmitter frequency to be readily changed over a band of frequencies. With a crystal-controlled oscillator, the transmitter may be tuned only to the exact crystal frequency or a harmonic thereof and when it is desired to change frequencies another crystal must be substituted.

However, variable frequency oscillators, whose frequency is controlled by a resonant circuit consisting of inductors and condensers, have a tendency to drift over a period of time. To check the oscillator frequency, many variable frequency oscillators have heretofore had crystal-controlled calibrating oscillators associated with them. These oscillators generate a fundamental frequency and harmonics, and, in general, one of the harmonic frequencies falls within the adjustment range of the variable frequency oscillator. By mixing the output of the variable frequency oscillator and the calibrating oscillator, in a mixing circuit, an audio beat frequency may be generated whose frequency is the difference between the two oscillator frequencies. Adjustment of the variable frequency oscillator to produce a zero beat frequency means that it is tuned to exactly the frequency (or a harmonic) of the crystal-controlled oscillator. Since this latter frequency is precisely determined by the crystal, the calibration of the variable frequency oscillator may be readily determined.

In variable frequency oscillators which are designed for general purpose use, and which may have a variety of loads, it is desirable to provide a matching and isolation circuit so that the relatively high output impedance oscillator may be coupled to a load such as a transmitter or cable without appreciable power loss and yet may be sufficiently isolated from the load to prevent interaction between them. A cathode follower circuit may be used for this purpose.

However, in the past each stage of variable frequency oscillators of the type described required one vacuum tube or transistor and the cathode follower stage required another. Thus, the minimum number of vacuum tubes or transistors required to perform all the necessary functions in a variable frequency oscillator was four: one for the variable frequency oscillator, one for the calibrating oscillator one for the mixer and another for the matching and isolating circuit.

In the variable frequency oscillator of my invention, I have provided a circuit which combines the calibrating oscillator and mixing functions with the matching and isolating functions so that only two vacuum tubes or transistors are required to perform all the previously mentioned functions.

In this combined circuit a switch is provided having a

"Calibrate" and an "Operate" position. In the "Calibrate" position the circuit functions as a calibrating oscillator and mixer, while in the "Operate" position it functions as a matching and isolating circuit.

Accordingly, it is a principal object of my invention to provide an improved variable frequency oscillator of the type described.

Another object of my invention is to provide a variable frequency oscillator which is inexpensive in construction, in that fewer components are used as compared to variable frequency oscillators heretofore available, while yet performing all the functions of previous variable frequency oscillators.

Still another object of my invention is to provide a variable frequency oscillator of the type described for use in controlling amateur radio transmitters.

A further object of my invention is to provide a circuit using a single vacuum tube or transistor which may function either as a crystal controlled oscillator and mixer, or as a cathode follower depending on the position of a single switch.

Other and further objects of my invention will in part be obvious and will in part appear hereinafter.

For a better understanding of the nature and objects of my invention, reference should be made to the following detailed description taken in connection with the accompanying drawing which is a schematic circuit diagram of an improved variable frequency oscillator which incorporates my invention.

As shown in the figure, a conventional tuned plate, tuned grid oscillator utilizes triode 10 as its active element. The plate circuit of this triode includes an inductor 12 which is connected in series to ground through capacitor 14. Power supply 16 which is of conventional design, supplies appropriate plate voltage to one end of inductor 12. Inductor 12 together with stray capacitances associated with tubes 10 and 38 form a fixed tuned circuit. The grid **10*a* of triode 10 is connected via grid capacitor 18 to the movable contact 20*a* of switch 20. Tuned circuits generally indicated at 22 and 24 are connected respectively to fixed switch contacts 20*b* and 20*c*. Each of the tuned circuits is of the same configuration and accordingly only circuit 22 will be described. A pair of fixed capacitors 22*a* and 22*b* of standard values tune the inductance 22*c* to the approximate desired frequency. Variable capacitor 22*d* is used as a trimmer to provide a screw driver adjustment to set the tuned circuit so that the tuning dial associated therewith is properly calibrated. The tuning capacitor for circuit 22 is capacitor 22*e* and as shown by the dotted line this is ganged with the corresponding capacitor in circuit 24, both being connected to a frequency calibrated tuning dial (not shown). In practice, I have found that circuit 22 should cover a frequency range of 8.0 to 8.33 mc. to cover the two-meter amateur band. The eighteenth harmonic of this frequency is then in fact the desired frequency for the two meter band. Capacitor 24*e* may tune circuit 24 and thus the oscillator frequency over a range of 8.33 to 9.0 mc., the sixth harmonic of this frequency being used to control transmitters on the six meter band. It will be observed that although the frequencies of the two bands are different by a factor of 3 the tuned circuits need cover a range of only one megacycle, and that the portions of this one megacycle range for each band are immediately adjacent each other. Terminals 26*a* and 26*b* are provided so that a crystal 28 may be inserted in the event that it is desired to utilize the oscillator as a crystal control oscillator, terminal 26*a* being connected to fixed terminal 20*d* of switch 20. Resistor 30, also connected to grid 10*a* of triode 10** performs the usual function of providing grid bias for the oscillator tube.

The cathode **10*b* of triode 10 is grounded during operation, but in the "Off" position of switch 32**, whose function is to be described in greater detail hereinafter, the cathode is open.

The output of the oscillator is connected via coupling capacitor 36 to the grid 38a of pentode 38. Pentode 38 is preferably of the sharp cutoff type and functions, as will be hereinafter explained in greater detail, as both an oscillator-mixer and as a cathode follower, depending upon the position of switch 32. As shown in the figure, switch 32 has four positions, "Off," "Calibrate," "Standby" and "Operate." In the "Off" position the connection between ground and the cathode 10b of tube 10 and between ground and the output network generally indicated at 40, which is connected in series with the cathode 38b of pentode 38, are both open. This connection is made via terminals 32a, b, c and d, wiper 32e, and terminals 32f, g and h in both the "Calibrate" and "Operate" positions. Thus the tubes 10 and 38 can function only in these positions.

When switch 32 is thrown to the "Calibrate" position (position II in the figure) the circuit configuration associated with tube 38 is as follows. Grid 38a is connected to cathode 38b via resistor 42, the cathode being grounded through resistor 44 and inductor 46, these latter two components forming the network 40 previously mentioned. Resistor 42 acts as a grid leak resistor and is connected to the cathode for convenience in securing proper grid bias. A calibrating crystal 45 having a frequency of 1 megacycle is connected between the grid 38a and the screen grid 38c to determine the frequency of the calibrating oscillator. The calibrating oscillator is also of the tuned-plate tune-grid type, the screen grid 38c being used as the oscillator plate. This oscillator plate circuit is fixed tuned at about 1 megacycle, capacitor 50 and inductor 48 forming the resonant circuit. The calibrating oscillator signal, which is one megacycle and the higher harmonics thereof, mixes with the signal from the variable frequency oscillator in tube 38 to provide beat frequency signals. These beat frequency signals are also amplified by the pentode 38, the plate 38d of which is connected via resistor 52 to the power supply 16 as a typical amplifier. The beat frequency output signal is coupled via condenser 54 to output jack 56.

Thus, by inserting a set of head phones or other audio frequency indicator in jack 56, the frequency of the variable frequency oscillator may be checked at various check points throughout its range. If there is an error between the frequency indicated by the dial associated with variable condensers 22e and 24e, the oscillator frequency and trimmer condensers 22d or 24d may be adjusted to correct for this discrepancy.

After the oscillator has been calibrated in the manner described, switch 32 is then moved to the "Standby" position (position III in the drawing). In this position the cathodes of both tubes are ungrounded, and a rather large condenser 58 (0.01 μf.) is connected between the calibrating oscillator plate (screen grid 38c) and ground. This effectively grounds plate 38c for radio frequency operation. It will also be observed that resistor 42 is connected in this switch position, in parallel with crystal 45, this adjusts the bias on the grid of tube 38 to increase the quiescent current through the tube to provide a greater output signal in the "Operate" position.

These same connections are maintained when switch 32 is placed in the "Operate" position (position IV in the drawing). In this latter position, the cathodes of both tubes are grounded, cathode 10b directly and cathode 38b through network 40. In this switch position, tube 38 functions as a cathode follower with cathode resistor 44; the output of the oscillator is connected via condenser 60 to output jack 62. As is well known, a cathode follower has a low output impedance and is well adapted to match the impedance of a coaxial line, or other radio frequency cable which may be coupled to jack 62 to carry the variable frequency oscillator signal to the transmitter to be controlled. The inductor 46 tends to minimize the capacitive loading effects of any radio frequency line which may be coupled to jack 62.

It will thus be seen that tube 38 functions as both a calibration oscillator and mixer and as a cathode follower depending upon the position of switch 32. It will also be observed that the only point which it is necessary to switch to accomplish this change, is the junction of resistor 42 and condenser 58 which is connected either to the cathode or the screen grid of pentode 38 depending upon which mode of operation is desired. Thus a simple and inexpensive variable frequency oscillator using only two vacuum tubes is provided and these may, if desired be in a single envelope. I have found, for example, that a type 6BH8, tube will perform the functions described herein, and thus the circuit will require only a single tube envelope.

It will be understood of course that the circuit shown herein might be built utilizing transistors or similar devices in place of vacuum tubes. Accordingly, the words "active controlled electron flow devices" as used herein and in the claims are intended to refer both to vacuum tube, transistors or like devices.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described my invention, what I claim as new and desire to secure by Letters Patent is:

1. Apparatus for providing a calibrated radio frequency electrical signal of variable frequency comprising, in combination, a variable frequency oscillator for generating said signal and an output stage including a single active controlled electron flow device and a switch having at least two positions, circuit means connected between a first electrode of said controlled electron flow device and ground, a second electrode and a third electrode of said controlled electron flow device being connected as a calibrating oscillator controlled by frequency determining means connected between said second and said third electrodes, means connecting the output signal from said variable frequency oscillator between ground and said second electrode, said switch when in a first position connecting a circuit element having a low impedance in shunt with the circuit connected between said first electrode and ground whereby said controlled electron flow device operates as an oscillator-mixer, and said switch when in a second position disabling said calibrating oscillator circuit by connecting said low impedance circuit element between said third electrode and ground, whereby said electron flow device acts as an impedance matching and isolating device between said variable frequency oscillator and a load circuit.

2. The combination defined in claim 1 in which the active controlled electron flow device is a sharp cut-off pentode vacuum tube.

3. Apparatus for providing a radio frequency electrical signal of variable frequency comprising, in combination, a variable frequency oscillator for generating said signal, and an output stage, said output stage including a switch having at least two positions and a sharp cut-off pentode, a tuned circuit connected to the screen grid of said pentode, a frequency determining element connected between the screen grid and the control grid of said pentode, means connecting the output of said variable frequency oscillator to the control grid of said pentode, a resistor connected to the control grid of said pentode, a condenser connected in series with said resistor and ground, said switch connecting the junction of said resistor and condenser to the cathode of said pentode when in a first position thereof, and said switch connecting the junction of said resistor and condenser to the screen grid of said tube when in a second position thereof, and a resistor connected between the cathode of said pentode and ground when said switch is in either of said first or second positions.

4. The combination defined in claim 3 in which the plate of said pentode is connected to a source of plate voltage through a resistor and which includes means connected to the plate of said pentode for connecting the signal developed thereon to an output connector.

5. The combination defined in claim 3 in which said frequency determining element is a piezoelectric crystal, the frequency of said crystal and the resonant frequency of the tuned circuit connected to said screen grid of said pentode being substantially identical.

6. The combination defined in claim 3 in which said condenser is sufficiently large to present a negligible impedance at the frequency of said frequency determining element.

7. The combination defined in claim 3 which includes an output connector and means connecting said output connector to the cathode of said pentode.

References Cited in the file of this patent

UNITED STATES PATENTS

| | | |
|---|---|---|
| 2,248,481 | Schuttig | July 8, 1941 |
| 2,766,381 | Davis | Oct. 9, 1956 |
| 2,866,162 | Rosen et al. | Dec. 23, 1958 |